United States Patent
Hamada

(10) Patent No.: US 6,888,096 B1
(45) Date of Patent: May 3, 2005

(54) LASER DRILLING METHOD AND LASER DRILLING DEVICE

(75) Inventor: Shiro Hamada, Hiratsuka (JP)

(73) Assignee: Sumitomo Heavy Industries, Ltd., Tokyo (JP)

(*) Notice: Subject to any disclaimer, the term of this patent is extended or adjusted under 35 U.S.C. 154(b) by 373 days.

(21) Appl. No.: 10/088,495

(22) PCT Filed: Sep. 25, 2000

(86) PCT No.: PCT/JP00/06569

§ 371 (c)(1),
(2), (4) Date: Mar. 27, 2002

(87) PCT Pub. No.: WO01/23131

PCT Pub. Date: Apr. 5, 2001

(30) Foreign Application Priority Data

Sep. 28, 1999 (JP) .......................... 11-274079

(51) Int. Cl.[7] .............................................. B23K 26/00
(52) U.S. Cl. ................................. 219/121.7; 219/121.71
(58) Field of Search ........................ 219/121.7, 121.71, 219/121.78, 121.82, 121.85

(56) References Cited

U.S. PATENT DOCUMENTS

| | | | | |
|---|---|---|---|---|
| 3,440,388 A | * | 4/1969 | Meeks et al. ............... | 219/69.1 |
| 4,887,283 A | * | 12/1989 | Hosono ........................ | 378/35 |
| 5,587,094 A | * | 12/1996 | Yoshida et al. ......... | 219/121.68 |
| 5,730,924 A | * | 3/1998 | Katoh et al. ................. | 264/488 |
| 5,815,494 A | * | 9/1998 | Yamazaki et al. ............. | 372/25 |
| 6,034,349 A | * | 3/2000 | Ota ........................ | 219/121.73 |
| 6,211,485 B1 | * | 4/2001 | Burgess .................... | 219/121.7 |
| 6,599,790 B1 | * | 7/2003 | Yamazaki et al. .......... | 438/166 |

FOREIGN PATENT DOCUMENTS

| | | |
|---|---|---|
| JP | 5-318160 | 12/1993 |
| JP | 07-001172 | 1/1995 |
| JP | 07-193374 | 7/1995 |
| JP | 08-066781 | 3/1996 |
| JP | 08-257770 | 10/1996 |
| JP | 09-029473 | 2/1997 |
| JP | 9-94683 | 4/1997 |
| JP | 10-58178 | 3/1998 |
| JP | 10-244392 | 9/1998 |
| JP | 11258498 | 9/1999 |

* cited by examiner

Primary Examiner—M. Alexandra Elve
(74) Attorney, Agent, or Firm—Squire, Sanders & Dempsey L.L.P.

(57) ABSTRACT

It is provided with a homogeneous optical system 13 for transforming laser light from a laser oscillator 10 into laser light having a linear cross-section and a drive mechanism for synchronously moving a mask 11 and a printed circuit board 12, an irradiation position of the linear laser light being fixed, the drive mechanism moving the mask and the workpiece so that the mask passes through the irradiation position of the laser light while the moving direction thereof is perpendicular to the extending direction of the linear laser light so that the mask is scanned by the linear laser light, the drilling defined by the mask pattern thereby being carried out to the workpiece.

16 Claims, 11 Drawing Sheets

(a)

FIG. 2
(a) 
(b) 
FIG. 3
(a) 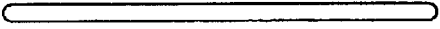
CROSS-SECTIONAL SHAPE OF LASER LIGHT
(b) 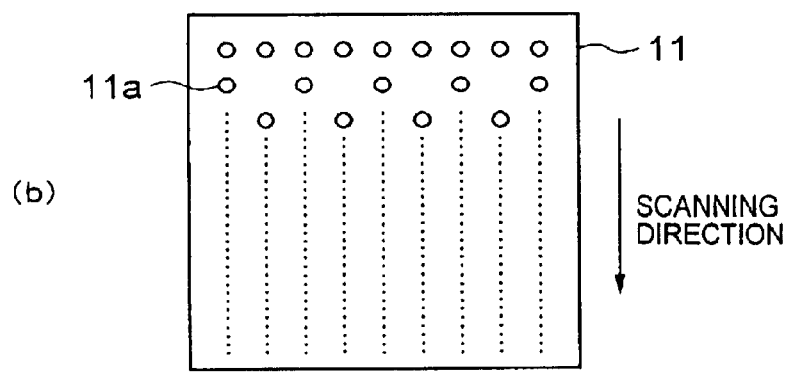
SCANNING DIRECTION
FIG. 4
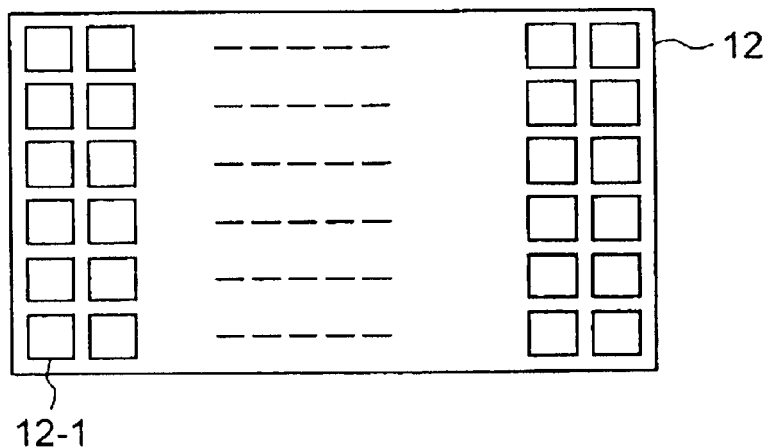

LASER DRILLING METHOD AND LASER DRILLING DEVICE

TECHNICAL FIELD

The present invention relates to a method and an apparatus for laser drill in which works such as printed circuit boards and ceramic substrates are irradiated with laser light from a laser oscillator.

BACKGROUND ART

With trends toward miniaturization and high-density mounting of electronic components, high density is required for printed circuit boards. For example, an interposer is known as a printed circuit board for packaging by mounting LSI chips. Although bonding between such LSI chips and the interposer has been primarily performed by wirer bonding processes, flip-chip mounting tends to increase. Furthermore, the number of pins in packages is rapidly increasing.

With such trends, holes having small diameters with fine pitches, called via holes, must be provided in the interposer.

Though such drill has been performed by a mechanical machining process using a fine mechanical drill or by an exposure (photo-via) process, laser light is being used recently. A drilling apparatus using laser light is superior to mechanical machining using fine drills in view points of processing rate and ready forming fine holes. As laser light, $CO_2$ laser and harmonic solid-state laser are generally used because of a low price of the laser oscillator and reduced operation costs.

Drill by a known laser drill apparatus is as follows. A laser beam from a laser oscillator is introduced to an optical scanning system having a biaxial galvanometer mirror called an X-Y scanner or galvanoscanner via an optical path including a reflecting mirror and the like. The optical scanning system scans the laser beam and introduces the beam on a printed circuit board through a processing lens (for example, Japanese Unexamined Patent Publication No. 10-58178). Since positions of holes to be formed in the printed circuit board are preliminarily determined, the optical scanning system is controlled according to the information on the positions of these holes to form holes one by one.

Problems to be Solved by the Invention

However, in the one-by-one drill using the optical scanning system having the X-Y scanner or galvanoscanner, the operation time increases in proportion to the number of the holes in the printed circuit board. Since the response of the galvanoscanner is about 500 pps, it is difficult to form 500 or more holes per second. Suppose that holes with a diameter of 50 $\mu$m are arranged at a pitch of 0.2 mm in a square package board with a side of 10 mm, the number of the holes is 2,500. In this case, the processing time required is 2,500/500=5 sec at a drill rate of 500 holes/sec.

Accordingly, an object of the present invention is to provide a method for laser drill that can form many holes within a short time compared with known laser drilling methods.

Another object of the present invention is to provide a method for laser drill that can select an appropriate processing pattern for a workpiece.

Still another object of the present invention is to provide an apparatus for laser drill suitable for the above method.

DISCLOSURE OF INVENTION

The present invention is a laser drilling method for carrying out the drilling by irradiating a workpiece with laser light from a laser oscillator through a mask having a predetermined mask pattern. In a first aspect of the present invention, said laser light is transformed into laser light having a linear cross-section, and an irradiation position of said linear laser light is fixed. Furthermore, said mask and said workpiece are synchronously moved so that said mask passes through an irradiation position of said laser light while the moving direction thereof is perpendicular to the extending direction of said linear laser light so that said mask is scanned by said linear laser light. Thereby, the drilling defined by said mask pattern is carried out to said workpiece.

In the laser drilling method according to the first aspect, by arranging an imaging lens between said mask and said workpiece, the projection ratio of said mask pattern to said workpiece can be set.

In the laser drilling method according to the first aspect, the displacement of said mask or said workpiece is detected, and the oscillation operation of said laser oscillator may be controlled in accordance with the detected displacement.

In a second aspect of the present invention, said laser light is transformed into laser light having a linear cross-section, said mask arranged at a predetermined position is irradiated with the linear laser light. Furthermore, said workpiece is moved in the perpendicular direction to the extending direction of said linear laser light, so that said workpiece is scanned by the laser light passing through said mask. Thereby, the drilling defined by said mask pattern is carried out to said workpiece.

In the laser drilling method according to the second aspect, by arranging an imaging lens between said mask and said workpiece, the projection ratio of said mask pattern to said workpiece can be set.

In the laser drilling method according to the second aspect, the displacement of said workpiece is detected, and the oscillation operation of said laser oscillator may be controlled in accordance with the detected displacement. A laser drilling apparatus according to the present invention carries out the drilling by irradiating a workpiece with laser light from a laser oscillator through a mask having a predetermined mask pattern. The laser drilling apparatus according to a third aspect of the present invention is provided with an optical system for transforming said laser light into laser light having a linear cross-section; and a drive mechanism for synchronously moving said mask and said workpiece. An irradiation position of said linear laser light from said optical system is fixed. Said drive mechanism moves said mask and said workpiece so that said mask passes through an irradiation position of said laser light, and the moving direction thereof is made perpendicular to the extending direction of said linear laser light so that said mask is scanned by said linear laser light. Thereby, the drilling defined by said mask pattern is carried out to said workpiece.

The laser drilling apparatus according to the third aspect may be further provided with a position detector for detecting the displacement of said workpiece and a controller for controlling the oscillation operation of said laser oscillator in accordance with the displacement detected by said position detector.

In the laser drilling apparatus according to the third aspect, it may be provided with a position detector for detecting the displacement of said mask in place of the position detector for detecting the displacement of said workpiece and a controller for controlling the oscillation operation of said laser oscillator in accordance with the displacement detected by said position detector. A laser drilling apparatus according to a fourth aspect of the present invention is provided with an optical system for transforming said laser light into laser light having a linear cross-section and a drive mechanism for moving said workpiece. Said mask arranged at a predetermined position is irradiated with said linear laser light from said optical system. Said drive mechanism moves said workpiece in the perpendicular direction to the extending direction of the linear laser light so that said workpiece is scanned by the laser light passing through said mask. Thereby, the drilling defined by said mask pattern is carried out to said workpiece.

In the laser drilling apparatus according to the third and the fourth aspects, by arranging an imaging lens between said mask and said workpiece, the projection ratio of said mask pattern to said workpiece can be set by said imaging lens.

In addition, said optical system can be realized by a homogenizer.

Said optical system may comprises a homogeneous optical system that homogenizes the energy density about the cross-section of the laser light from said laser oscillator and a cylindrical lens that transforms the cross-section of the laser light from said homogeneous optical system into a linear shape.

In the above-mentioned laser drilling apparatus, if the mask is fixed, it may be further provided with a position detector for detecting the displacement of said workpiece and a controller for controlling the oscillation operation of said laser oscillator in accordance with the displacement detected by the position detector.

BRIEF DESCRIPTION OF THE DRAWINGS

FIG. 1(a) shows an overall configuration and FIG. 1(b) shows a main part, viewed from a different angle, of the configuration shown in FIG. 1(a).

FIG. 2 is for describing the operation which is for transforming the cross-section of laser light into a liner shape by the use of a homogeneous optical system and a cylindrical lens shown in FIG. 1, where FIG. 2(a) shows an energy density distribution at a cross-section of the laser light and FIG. 2(b) shows the cross-section of the transformed linear laser light.

FIG. 3 shows a cross-section (FIG. 3(a)) of the transformed linear laser light and an example of the mask (FIG. 3(b)) shown in FIG. 1.

FIG. 4 shows an example of a multiple printed circuit board that is processed using the apparatus according to the present invention.

FIG. 5(a) shows an overall configuration and FIG. 5(b) shows a main part, viewed from a different angle, of the configuration shown in FIG. 5(a).

FIG. 6(a) shows the configuration of the homogenizer and FIG. 6(b) shows the configuration of one of array lens sets shown in FIG. 6(a).

FIG. 7(a) shows the configuration of the homogenizer and FIG. 7(b) shows the configuration of another one of array lens sets shown in FIG. 7(a).

FIG. 9(a) shows an overall configuration and FIG. 9(b) shows a main part, viewed from a different angle, of the configuration shown in FIG. 9(a).

FIG. 10(a) shows an overall configuration and FIG. 10(b) shows a main part, viewed from a different angle, of the configuration shown in FIG. 10(a).

FIG. 12(a) shows an overall configuration and FIG. 12(b) shows a main part, viewed from a different angle, of the configuration shown in FIG. 12(a).

BEST MODE FOR CARRYING OUT THE INVENTION

Figure 1:
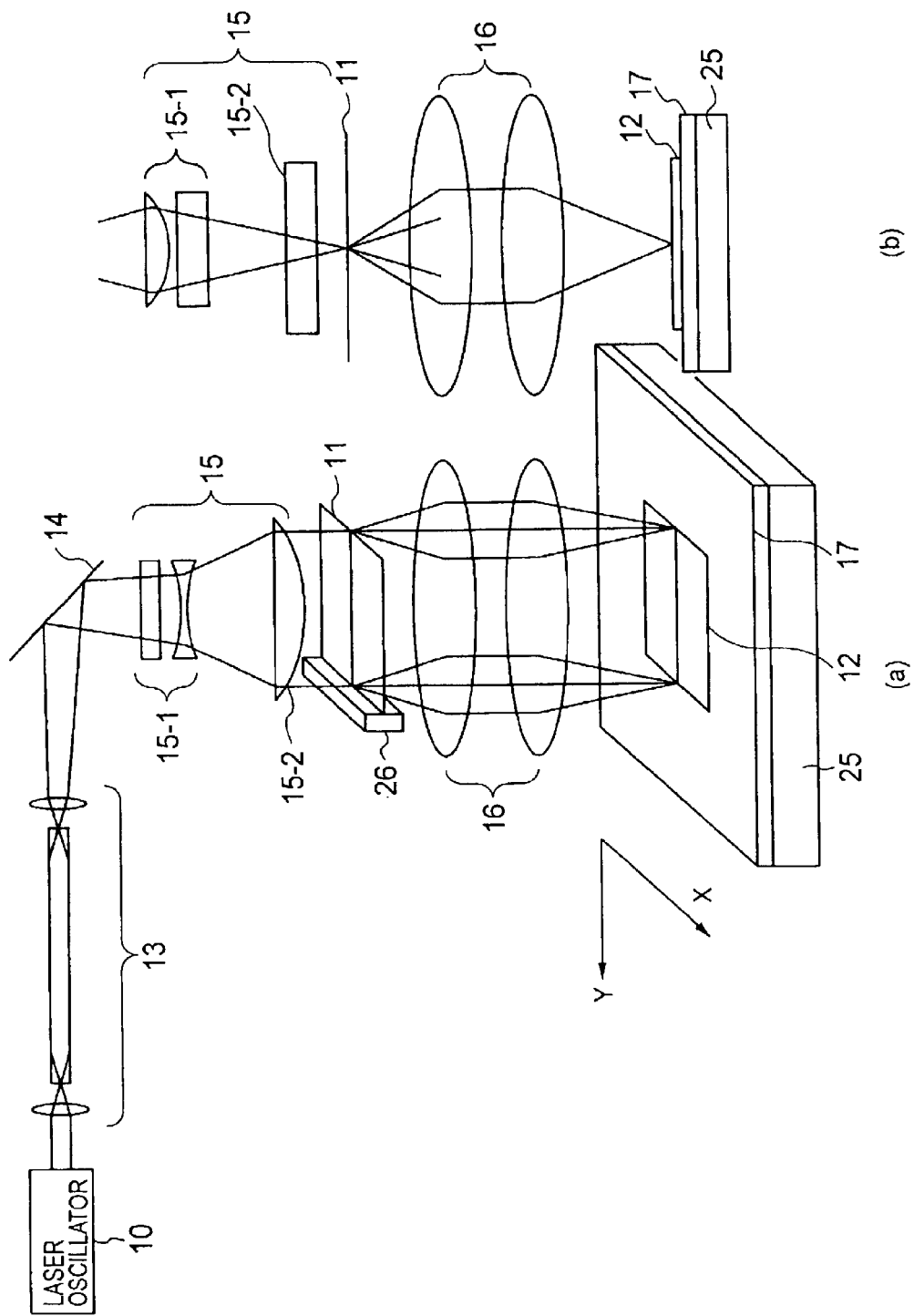
FIG. 1 shows a configuration of a laser drill apparatus according to a first embodiment of the present invention, where

Referring to FIG. 1, the first embodiment of a laser drill apparatus according to the present invention will now be described. In the embodiment, the description will be made with regard to the laser drill apparatus which is for carrying out the drilling by irradiating a printed circuit board (workpiece) 12 with pulsed laser light from a laser oscillator 10 through a mask 11 having a predetermined mask pattern.

The laser light from the laser oscillator 10 is homogenized in cross-sectional energy density by a homogeneous optical system 13. Here, the cross-sectional energy density is as follows. The laser light from the laser oscillator 10 generally has a circular cross-section. In this case, the energy density distribution at the cross-section is near the Gaussian distribution in which the energy density increases toward the center. The homogeneous optical system 13 transforms the laser light having such an energy density distribution into laser light having the same energy density at every portion.

With respect to a simple example of the homogeneous optical system 13, it is well known that the cross-sectional shape of the laser light from the laser oscillator 10 is enlarged by an optical lens and is introduced to the mask, so that only a portion having a high and flat energy density is extracted. Another example is bundle fibers composed of an assembly of many optical fibers. The cross-sectional shape of the laser light from the laser oscillator 10 is enlarged by an optical lens and introduced to the bundle fibers. The bundle fibers emit laser light having a homogeneous energy density distribution. Still another example is to use the principle of a kaleidoscope.

At any rate, the laser light transformed by the homogeneous optical system 13 and having a homogeneous energy density is incident on a cylindrical lens 15 via a reflective mirror 14. The cylindrical lens 15 is for transforming the cross-section of the laser light from the homogeneous optical system 13 into a linear cross-sectional shape.

Referring to FIG. 2, the laser light from the homogeneous optical system 13 has a circular cross-section and has a beam profile shown in FIG. 2(a). The beam profile represents a waveform which continues a constant energy value when the cross-section of the laser light is observed. Here, the beam profile is trapezoidal. By using the cylindrical lens 15, it is possible to transforms the laser light having a trapezoidal beam profile and a circular cross-section into laser light having a linear cross-sectional shape shown in FIG. 2(*b*). The cylindrical lens 15 includes a transverse cylindrical lens 15-1 defining the width of the laser light having the linear cross-sectional shape and a longitudinal cylindrical lens 15-2 defining the length of the laser light having the linear cross-sectional shape. Such a cylindrical lens 15 can form laser light having the linear cross-sectional shape with a width of ⅟10 mm to several millimeters and a length of several centimeters.

The laser oscillator 10, the homogeneous optical system 13, and the cylindrical lens 15 are fixed. That is, the irradiation direction of the laser light having the linear cross-sectional shape transmitted from the cylindrical lens 15 is fixed.

FIG. 3(*a*) shows the cross-sectional shape of the linearly shaped laser light. The size in the longitudinal direction of the laser light is set to be slightly larger than the size in the width direction of the mask 11 shown in FIG. 3(*b*). The mask 11 has a mask pattern including many holes, which define a processing pattern for the printed circuit board 12. This mask pattern may include many holes arranged into an N×N matrix, or many holes 11*a* arranged at random as shown in FIG. 3(*b*). This indicates the processing pattern for drilling according to this embodiment can be selected from various options.

An imaging lens 16 is for determining the projection ratio (scale ratio) of the mask pattern to the printed circuit board 12. FIG. 1 shows a projection ratio of 1:1. On the other hand, the printed circuit board 12 is loaded on a work stage 17 movable along an X-axis and a Y-axis. In particular, this embodiment is characterized in that a mask stage (not shown) for holding and moving the mask and the work stage 17 are synchronously movable. The work stage 17 can be moved in the X-axis and the Y-axis in the same horizontal plane by a work stage drive mechanism 25. In this embodiment, the mask stage can be moved in the X-axis by a mask stage drive mechanism 26.

During the drilling, the mask stage drive mechanism 26 and the work stage drive mechanism 25 are synchronously controlled by a controller (not shown). Concretely, the mask 11 and the printed circuit board 12 are synchronously moved in the opposite directions by the mask stage drive mechanism 26 and the work stage drive mechanism 25, respectively. Specifically, the mask 11 passes through the position of the laser light propagating from the cylindrical lens 15, and the moving direction of the mask 11 is perpendicular to the extending direction of the laser light having the linear cross-sectional shape. This means that the laser light having the linear cross-sectional shape seemingly scans the entire face of the mask 11. The laser light passing through the holes in the mask pattern of the mask 11 by such scanning reaches the printed circuit board 12 through the imaging lens 16. Since the movement of the mask 11 and the movement of the printed circuit board 12 are synchronized with each other in the opposite directions, many holes defined by the mask pattern of the mask 11 are continuously formed in the printed circuit board 12.

In the case of the projection ratio of 1:1 by the imaging lens 16, the moving rate of the patterned laser light on the printed circuit board 12 is the same as the moving rate of the mask 11. In other words, the moving rate of the patterned laser light is the same as the scanning rate of the laser light to the mask 11. However, in the case of a scale ratio of 3:1 in which a demagnified mask pattern is projected onto the printed circuit board 12, the moving rate of the patterned laser light on the printed circuit board 12 is three times the scanning rate to the mask 11. The controller synchronously controls the mask stage drive mechanism 26 and the work stage drive mechanism 25 in consideration of such a difference in the moving rates.

In some cases, desired drill may not be completed by a single pulsed laser emission step due to the thickness of the printed circuit board 12. In this case, for example, when three shots of pulsed laser light are radiated, irradiation is performed such that the peak regions shown in FIG. 2(*a*) partly overlap with each other. This is realized by that the moving rate by the stage is decreased such that one hole is irradiated with a plurality of shots of pulsed laser light having the linear cross-sectional shape. In this case, it is preferable that holes 11*a* are arranged into a plurality of rows to form the mask pattern at the same pitch and masking is performed, if necessary. The masking will be described below.

The region of drill for forming many holes in the printed circuit board 12 by the above operation may be limited in some cases, though depending on the projection ratio of the imaging lens 16. In such a case, this region is a square area having a side of several centimeters. On the other hand, drill according to this embodiment is generally performed for each processing region of the multiple printed circuit board 12 including a plurality of delimited processing regions 12-1, as shown in FIG. 4. Although one processing region 12-1 is drilled by the above operation, the next processing region can not be drilled before the printed circuit board 12 is moved. For the reason, the printed circuit board 12 is moved by the work stage 17 for the next processing region. Namely, after the drilling for the processing region 12-1 in the printed circuit board 12 is completed, the work stage 17 moves the next processing region to a position right below the imaging lens 16. Of course, the work stage 17 and the mask 11 are independently driven.

By the way, the above movement of the processing region requires a certain time. On the other hand, the laser light must be inhibited from entering the mask 11 during the above movement, whatever the laser oscillator 10 emits continuous laser light or pulsed laser light. This is realized by that the oscillation of the laser oscillator 10 is suspended during the movement. Another countermeasure is to provide means for bypassing the laser light to an optical pass upstream of the cylindrical lens 15. Such bypass means is achieved by rotating the reflective mirror 14. Namely, the reflective mirror 14 is rotated during the movement so that the laser light travels toward a position deviating from the cylindrical lens 15. In this case, it is preferable that a target is disposed at a position of the propagating laser light when the reflective mirror is rotated. The target is for absorbing the energy of the laser light. At any rate, such operation is called masking and is also applied to the above-mentioned masking.

The description of the moving rate of the patterned laser light and the subsequent descriptions will be applied to a second embodiment described below.

Figure 5:
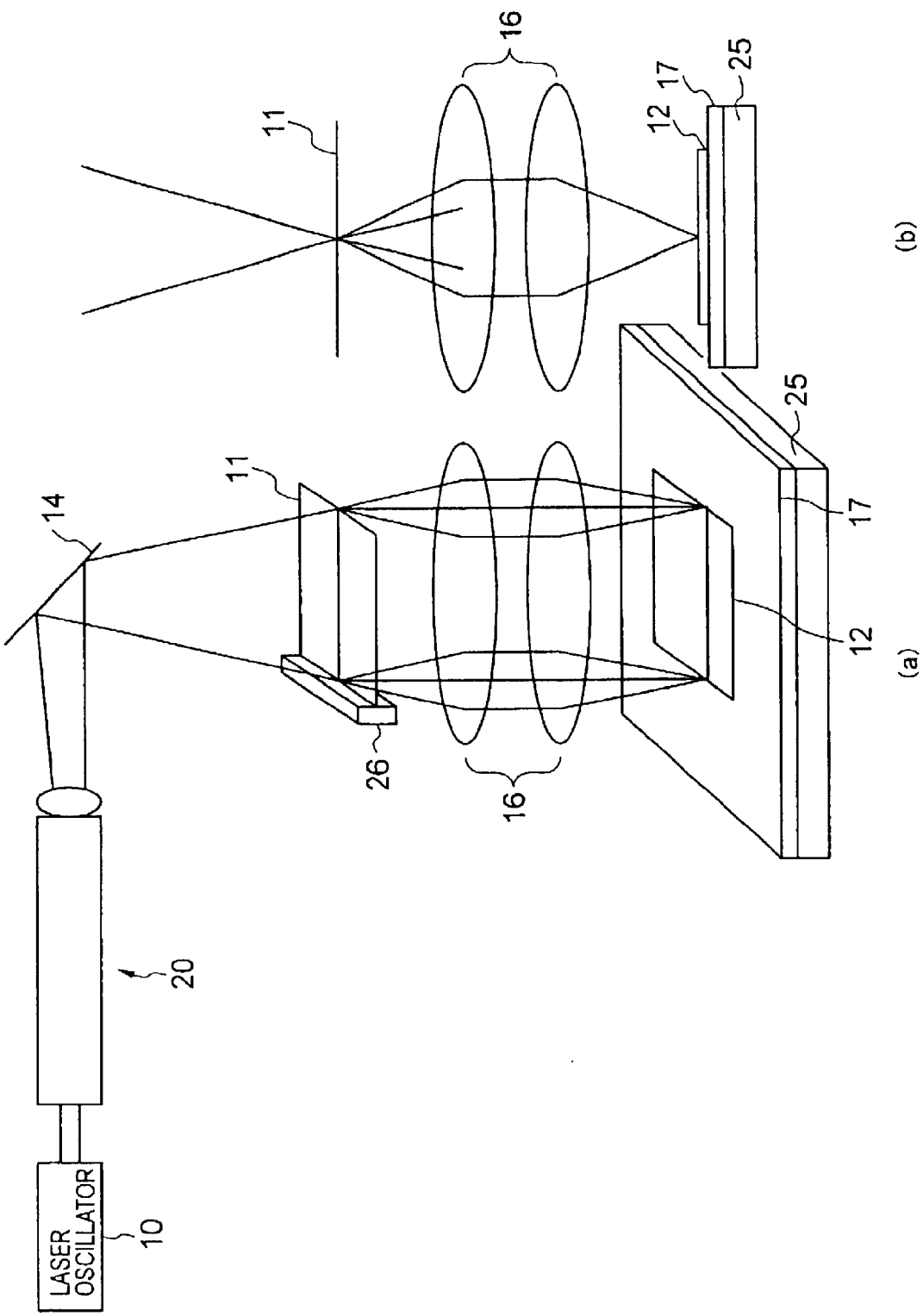
FIG. 5 shows a configuration of a laser drill apparatus according to a second embodiment of the present invention, where

Referring to FIG. 5, the second embodiment of the present invention will be described. In this embodiment, in place of the homogeneous optical system 13 and the cylindrical lens 15 in the first embodiment shown in FIG. 1, a homogenizer 20 is arranged between the laser oscillator 10 and the reflective mirror 14. The other configurations are quite the same as those in the embodiment shown in FIG. 1. The homogenizer 20 has functions both the homogeneous optical system 13 and the cylindrical lens 15 and will be described in brief with reference to FIGS. 6 to 8, though it is known.

Figure 6:
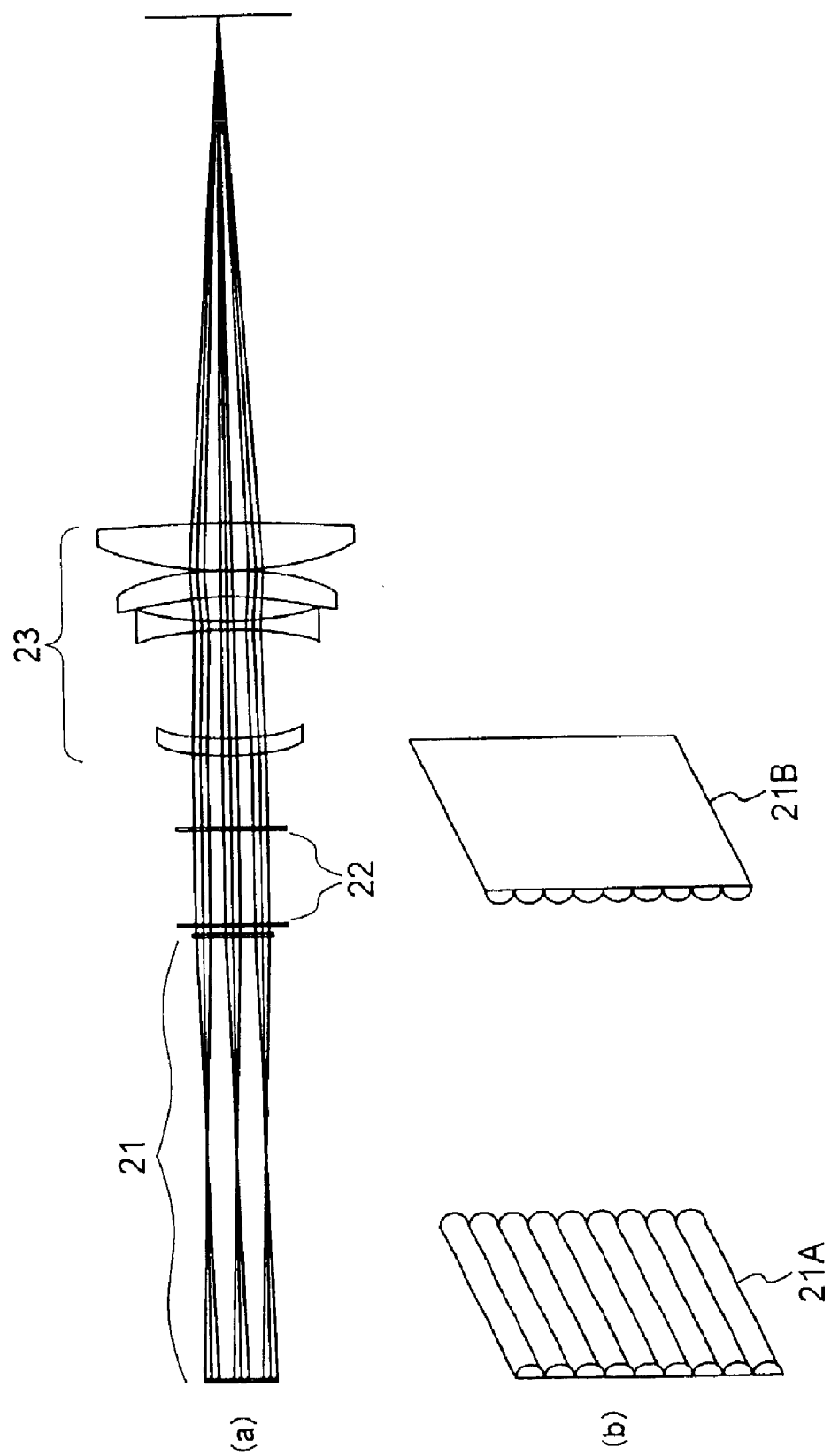
FIG. 6 is for describing the configuration of a homogenizer shown in FIG. 5 where
Figure 7:
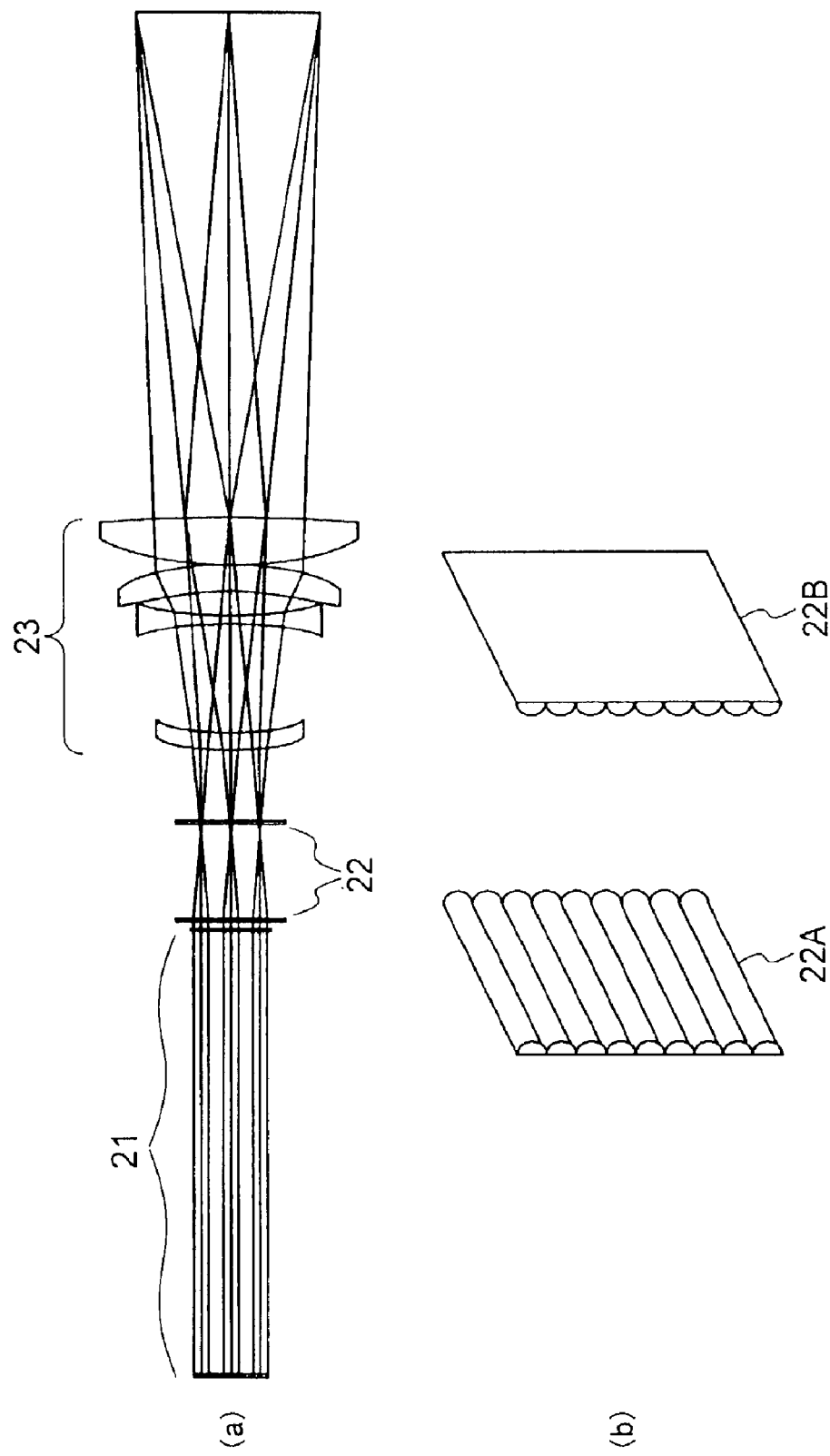
FIG. 7 illustrates the configuration of the homogenizer when the state shown in FIG. 6 is rotated by 90 degree around the axis of the homogenizer, where
Figure 8:
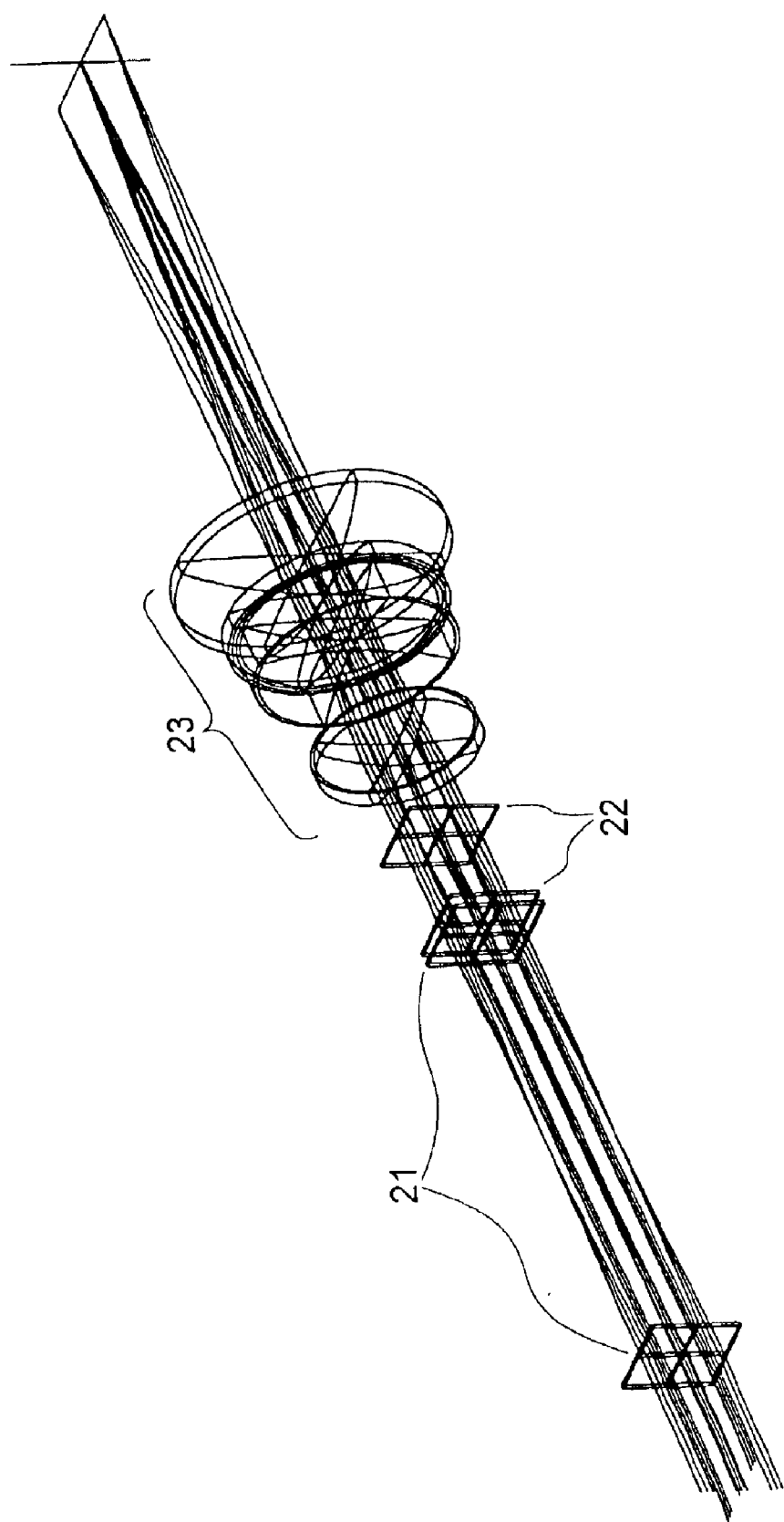
FIG. 8 is a stereoscopic isometric view of the homogenizer shown in FIG. 5.

The homogenizer 20, for example, includes two array lens sets 21 and 22 and a lens system 23 having four focusing lenses. As shown in FIG. 6, the array lens set 21 includes array lenses 21A and 21B opposing at a distance so that the concave faces oppose each other, each being an integration of a plurality of cylindrical lenses arranged parallel to each other. Similarly, as shown in FIG. 7, the array lens set 22 includes array lenses 22A and 22B opposing at a distance so that the concave faces oppose each other, each being an integration of a plurality of cylindrical lenses arranged parallel to each other. FIG. 7 shows a state when the state shown in FIG. 6 is rotated by 90 degree around the axis. Accordingly, the array lens sets 21 and 22 are combined so that the extending direction of the cylindrical lenses of the array lens set 21 is perpendicular to the extending direction of the cylindrical lenses of the array lens set 22.

At any rate, by the two array lens sets 21 and 22 and the lens system 23 including the four focusing lenses mentioned above, the homogenizer 20 has the function for homogenizing the cross-sectional energy density distribution and the function for transforming the laser light having the circular cross-section into the laser light having the linear cross-sectional shape.

Since the operation for drilling is quite the same as that in the first embodiment, the description thereof will be omitted.

Figure 9:
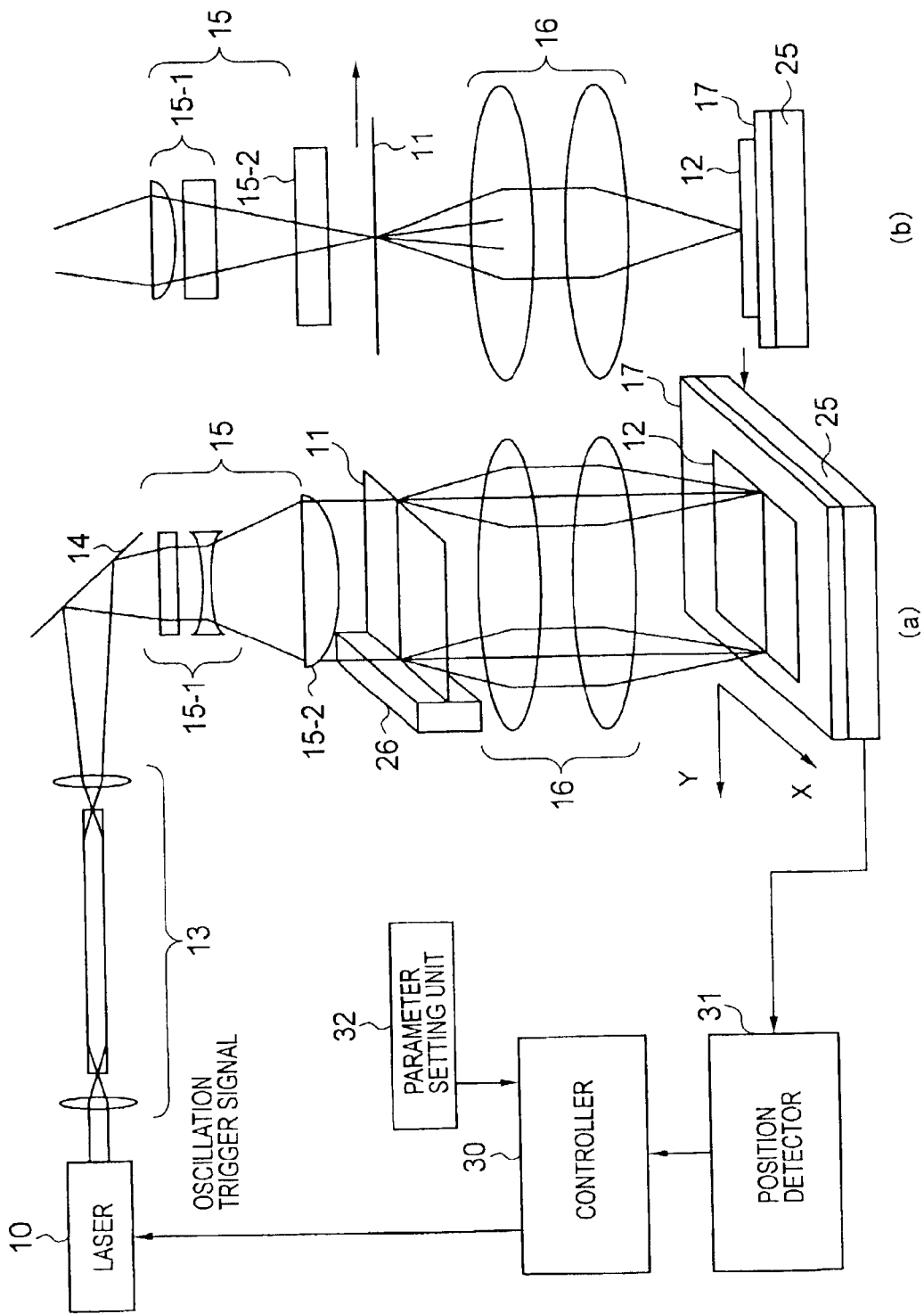
FIG. 9 shows a configuration of a laser drill apparatus according to a third embodiment of the present invention, where

Referring to FIG. 9, a third embodiment of the present invention will be described. This embodiment differs from the first embodiment in the following points. In the first embodiment, the oscillation operation of the laser oscillator 10 is continuous. In contrast, in the third embodiment, the oscillation operation of the laser oscillator 10 is controlled based on the displacement or position of the printed circuit board 12. Concretely, the printed circuit board 12 is moved at a constant rate. A controller 30 outputs an oscillation trigger signal to the laser oscillator 10 in response to the detected signal from a position detector 31 when the printed circuit board 12 reaches a predetermined position. The laser oscillator 10 starts on reception of the oscillation trigger signal and emits the laser light. This means that the laser oscillator 10 oscillates in synchronism with the movement of the printed circuit board 12 (work stage 17).

For the reason, in this embodiment, as means for detecting the displacement or position of the printed circuit board 12, the position detector 31 is provided for detecting the displacement of the work stage 17, and the controller 30 is provided for controlling the laser oscillator 10 based on the displacement detected by the position detector 31. Other configurations and operations are the same as those in the first embodiment.

The position detector 31 can be realized by, for example, a combination with a linear encoder that directly detects the movement of the work stage 17. This is because of the following reason. Such a type of work stage drive mechanism 25 is often achieved by a linear drive mechanism using the principle of a linear motor. In this case, the linear encoder is often provided to control the position. The linear encoder outputs a pulse for every movement of fine unit distance (for example 1 μm) of the work stage 17. The position detector 31 counts the pulses and outputs the counted number to the controller 30.

On the other hand, the work stage drive mechanism 25 may be achieved by a mechanism that converts the rotational motion of a servomotor into a linear motion. In this case, the position detector 31 is achieved by a rotary encoder that detects the amount of rotation of the servomotor. The rotary encoder also outputs a pulse for every rotation of fine unit angle of the servomotor. The position detector 31 counts the pulses and outputs the counted number to the controller 30.

The above position detector 31 is merely an example, and therefore another well known position detector, which is not based on a combination with the linear encoder or the rotary encoder, may be used.

The controller 30 determines the displacement of the work stage 17, namely, the current position of the work stage 17, based on the counted number from the position detector 31. In addition, although the controller 30 is shown as another controller separated from the controller for synchronously controlling the work stage drive mechanism 25 and the mask stage drive mechanism 26, these controllers may be implemented by a single controller.

In this embodiment, as the same with the first embodiment, since the mask imaging process is used, the mask stage and the work stage 17 move by the same distance when the projection ratio (scale ratio) is 1:1, as described before. When the ratio of the mask size to the work (printed circuit board 12) is, for example, 2:1, the movement of the mask stage is two times the movement of the work stage.

The mask 11 moves in the reverse direction in synchronous with the movement of the printed circuit board 12. This is because the mask pattern of the mask 11 is inverted on the printed circuit board 12 by the imaging lens 16, as described before.

With the movement of the work stage 17, a pulse is output from the linear encoder or rotary encoder for every predetermined distance (for example, every 1 μm) and is counted up in the position detector 31.

For example, if the drill to the printed circuit board 12 is carried out at a pitch of 1 mm, the controller 30 outputs the oscillation trigger signal to the laser oscillator 10 when the counted number becomes equal to 1,000 (1,000 μm). In addition, before the drilling operation, the pitch of the holes is preliminarily input as a processing parameter through a parameter-setting unit 32.

The work stage 17 does not repeat the stepwise operation, namely, the operation that moves at a predetermined distance (corresponding to the pitch) and then stops, but moves at a constant rate. When a portion to be drilled in the printed circuit board 12 reaches a predetermined position, the position is irradiated with the laser light.

Since the operation of the laser drill apparatus is the same as that in the first embodiment, the description thereof will be omitted.

Figure 10:
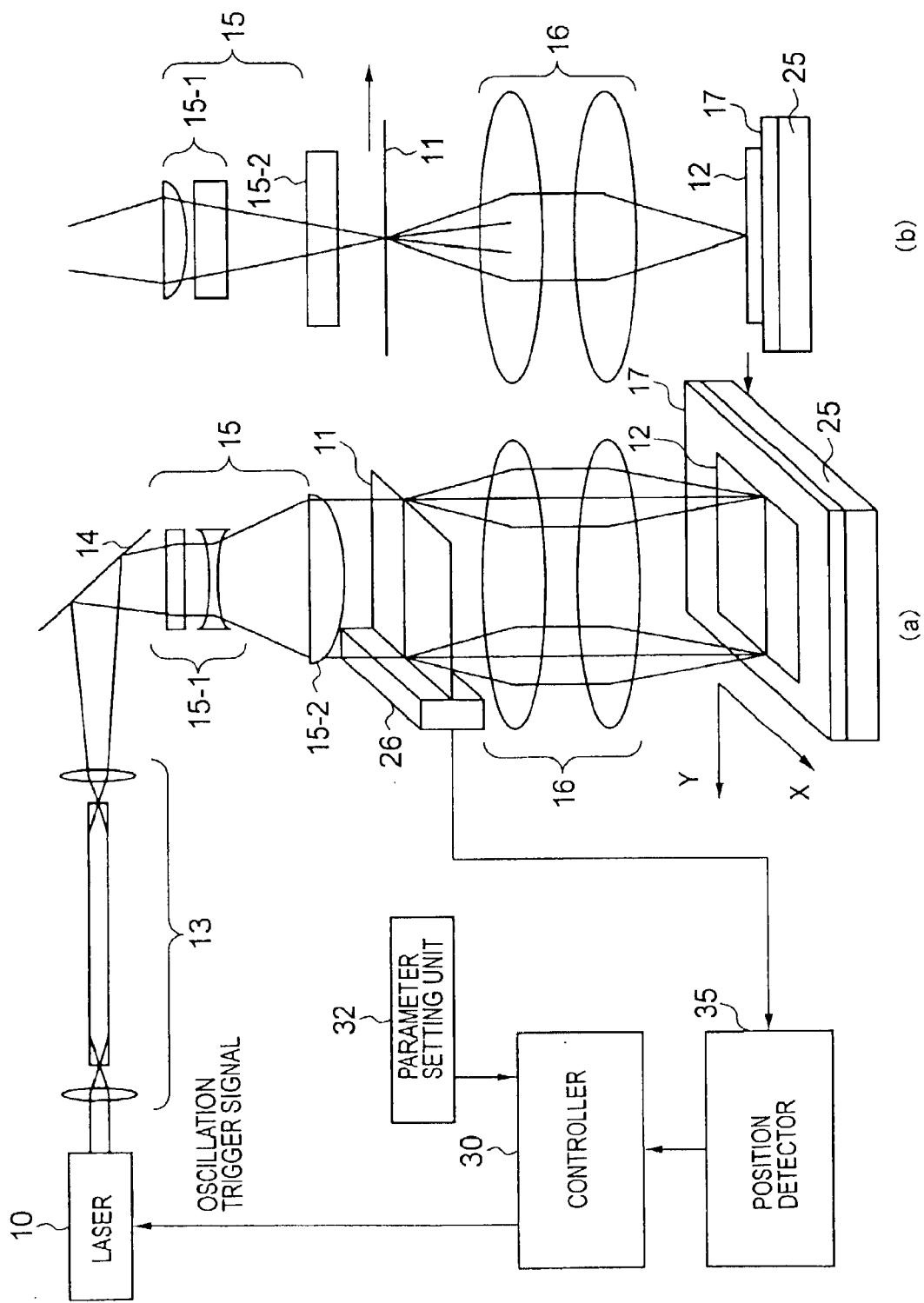
FIG. 10 shows a configuration of a laser drill apparatus according to a fourth embodiment of the present invention, where

Referring to FIG. 10, a fourth embodiment of the present invention will now be described. This embodiment differs from the third embodiment in the following points. In this embodiment, the oscillation operation of the laser oscillator 10 is controlled based on the displacement or position of the mask 11. Concretely, the mask 11 moves at a constant rate in synchronism with the movement of the printed circuit board 12. The controller 30 outputs the oscillation trigger signal to the laser oscillator 10 based on the detection signal from a position detector 35 when the mask 11 reaches a predetermined position. The laser oscillator 10 starts on reception of the oscillation trigger signal and emits the laser light. This means that the laser oscillator 10 oscillates in synchronism with the movement of the mask 11 (mask stage).

For the reason, in this embodiment, the position detector 35 for detecting the displacement of the mask stage as means for detecting the displacement or position of the mask 11 and the controller 30 for controlling the oscillation operation of the laser oscillator 10 based on the displacement detected by the position detector 35 are provided. Although the configurations and operations other than the position detector 35 are the same as those in the third embodiment, the position detector 35 may be the same as the position detector 31.

Namely, only one difference between the third embodiment and the fourth embodiment is that the object in synchronism with the oscillation of the laser oscillator 10 is the work stage 17 or the mask stage. As mentioned before, in the case of a projection ratio (scale ratio) of 1:1, the mask stage and the work stage 17 move by the same distance. In the case of a ratio of the mask size to the processing region 12-1 of 2:1, the mask stage moves by two times the moved distance of the work stage. Accordingly, the controller 30 in this embodiment carries out of the output of the oscillation trigger signal to the laser oscillator 10 in consideration of the above-mentioned projection ratio.

Since the operation of the laser drill apparatus is the same as that in the third embodiment, the description thereof will be omitted.

In both the third embodiment and the fourth embodiment, although the laser oscillator 10 oscillates upon reception of the oscillation trigger signal and emits the laser light, there is a time delay from the reception of the oscillation trigger signal to the oscillation. It is supposed that the time delay is 1 microsecond. It is also supposed that the oscillation frequency of the laser oscillator 10 is 150 Hz, and that the work stage 17 moves at a constant rate of 150 mm/sec. In this case, the time delay of 1 microsecond causes a misalignment of 0.15 $\mu$m from the target position of the laser light. However, there is no problem because such a misalignment is negligibly small. If the misalignment is not negligible, the above-mentioned misalignment can be compensated by addition of an offset to the processing parameter set by the parameter-setting unit 32.

In addition, the processing parameter set by the parameter-setting unit 32 is not limited by the pitch of the holes, the positions of the holes, in other words, coordinate data on the two-dimensional plane based on the X and Y axes may be set.

It is preferable that the pitch of the holes is a constant. This is because the oscillation frequency of the laser oscillator 10 is a constant if the pitch of the holes is a constant, as a result, a variation in the laser output intensity becomes small. However, the advantages according to the present invention are kept even if the pitch of the holes is not a constant.

A plurality of laser irradiation operations must be performed when the printed circuit board 12 is composed of a certain material. In such a case, the scanning operation by the movement of the mask 11 and the printed circuit board 12 may be repeated by a plurality of shots.

In both the third and fourth embodiments, the homogenizer 20 described in the second embodiment may be used instead of the homogeneous optical system 13 and the cylindrical lens 15.

Figure 11:
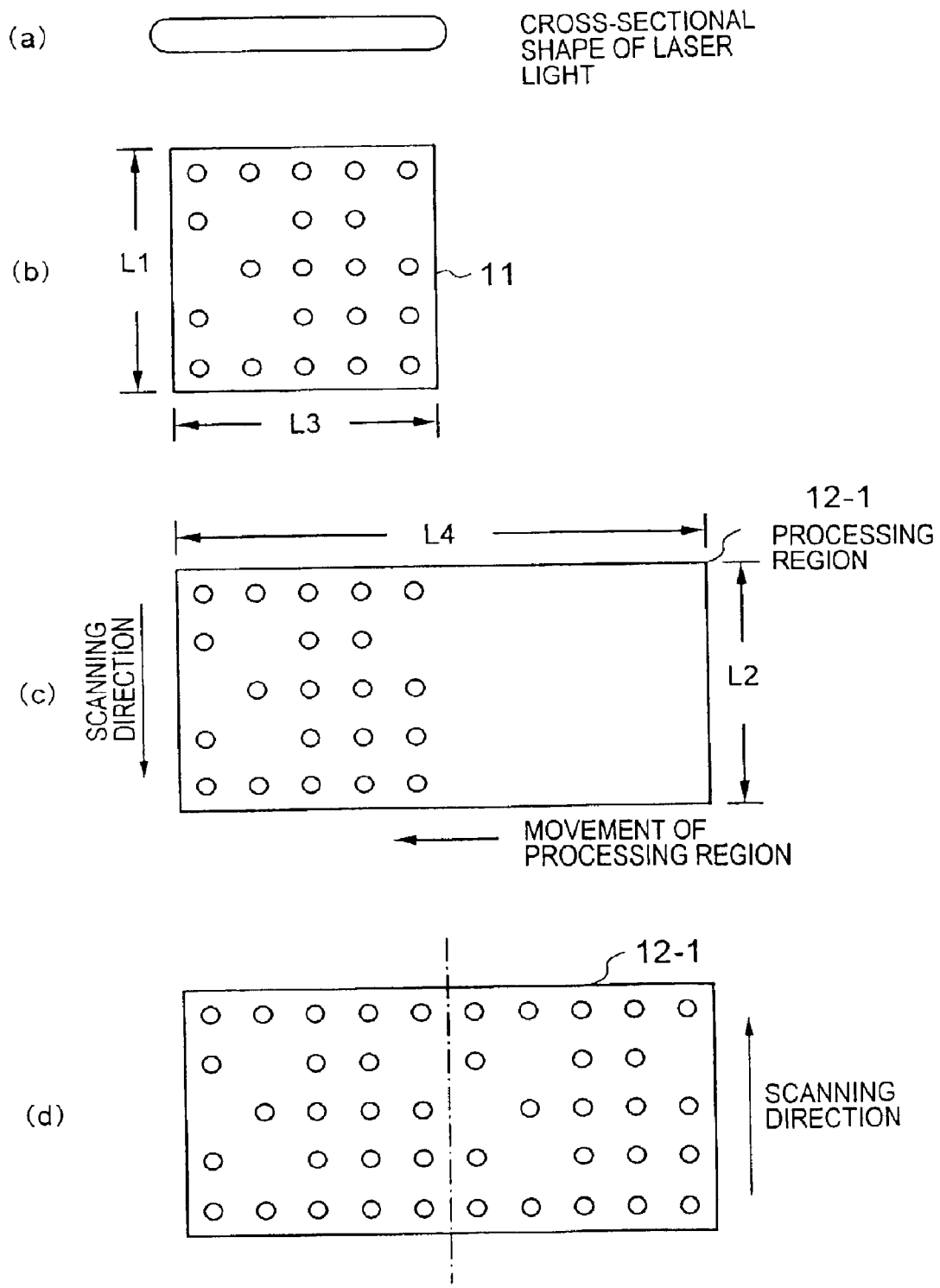
FIG. 11 shows the relationships among the cross-sectional shape of the laser light, the mask, and the processed pattern according to the third embodiment.

In addition, when the size of the mask 11 is smaller than the size of the processing region 12-1 of the printed circuit board 12, the operation is performed according to FIG. 11. In FIG. 11, it is supposed that the size L1 of the mask 11 in the scanning direction is equal to the size L2 of the processing region 12-1 in the scanning direction. It is also supposed that the size L3 of the mask 11 in the perpendicular direction to the scanning direction is ½ the size L4 of the processing region 12-1 in the perpendicular direction to the scanning direction. In such a case, after the half of the drilling for the processing region 12-1 is completed, the processing region 12-1 is moved by a predetermined distance in the perpendicular direction to the scanning direction and then the drilling is carried out. In this case, the scanning direction during processing in FIG. 11(d) is opposite to the scanning direction in FIG. 11(c). Of course, the formed holes have the same drill pattern.

Figure 12:
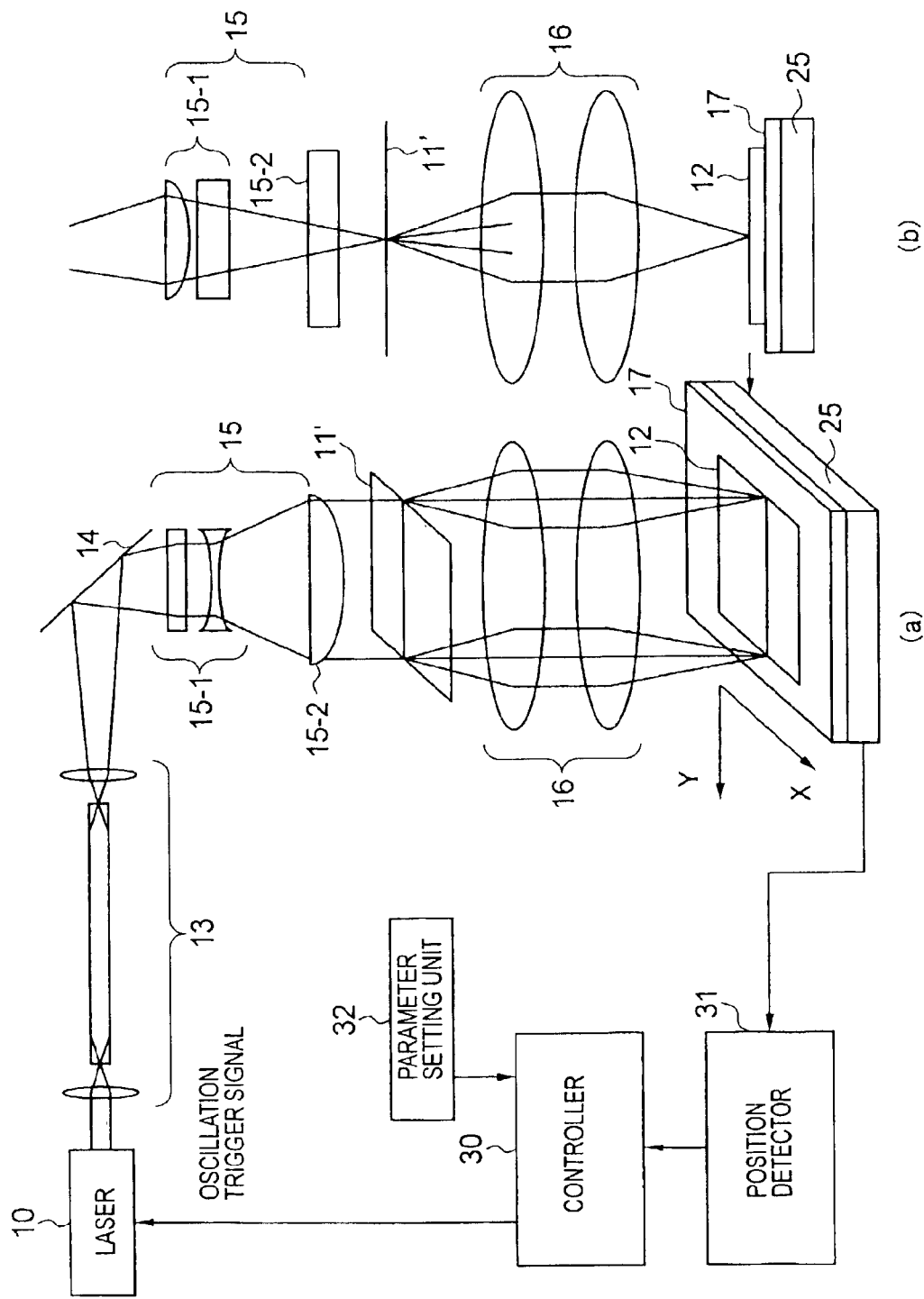
FIG. 12 shows a configuration of a laser drill apparatus according to a fifth embodiment of the present invention, where
Figure 13:
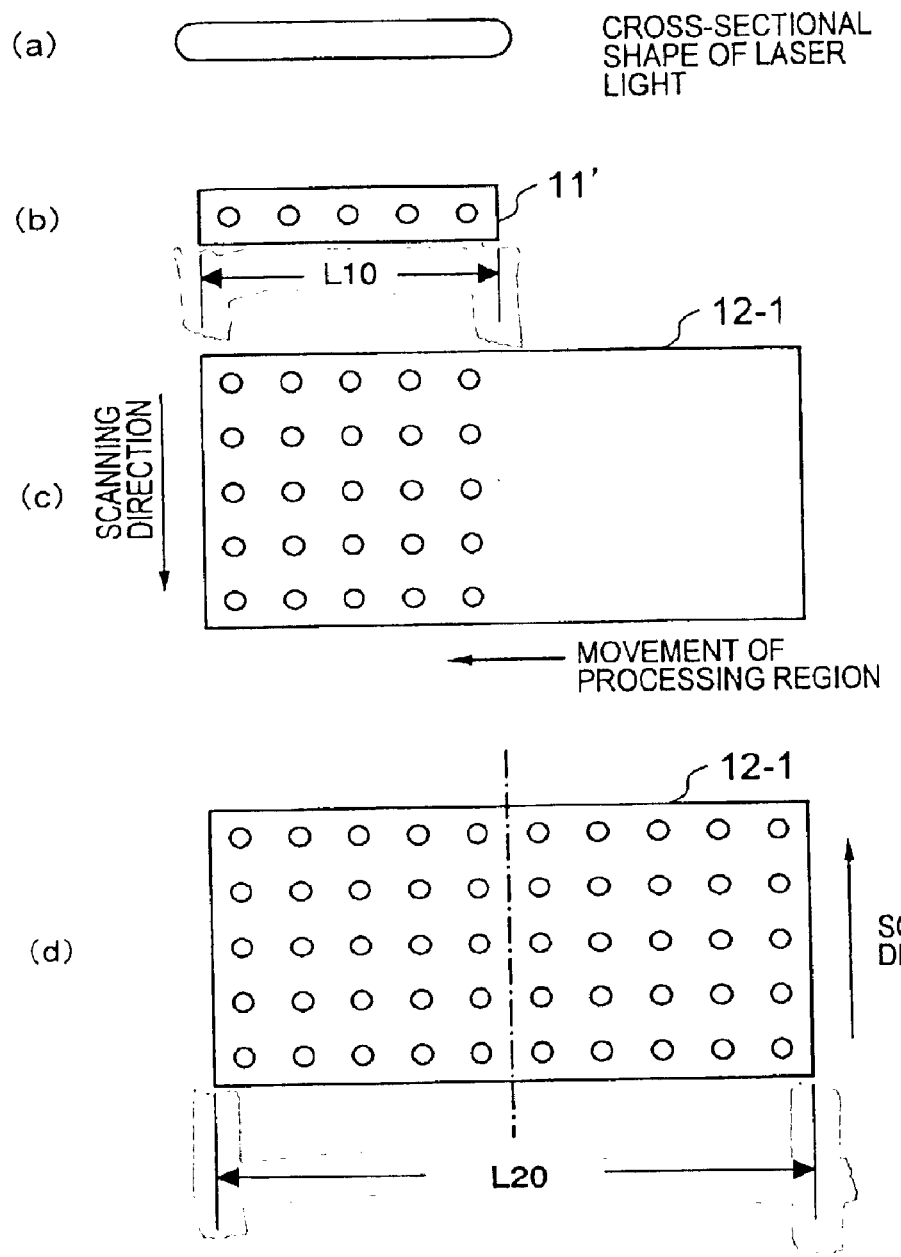
FIG. 13 shows the relationships among the cross-sectional shape (FIG. 13(a)) of the laser light, the mask (FIG. 13(b)), and the processed pattern (FIG. 13(c)) according to the third embodiment.

Referring to FIG. 12, a fifth embodiment of the present invention will now be described. This embodiment is a modification of the third embodiment and the mask 11' is fixed. Accordingly, the mask stage drive mechanism is not necessary. For the reason, the mask 11' has a single-row hole pattern as shown in FIG. 13 which is different from the mask 11 described in the above embodiments. The laser oscillator 10 is oscillated in synchronism with the movement of the printed circuit board 12 (work stage 17). The functions of the position detector 31, the controller 30, and the parameter-setting unit 32 are the same as those described in the third embodiment, the description thereof is omitted.

With the movement of the work stage 17, the pulse is output from the linear encoder or rotary encoder for every predetermined distance (for example, every 1 $\mu$m) and is counted up in the position detector 31.

For example, in the drill of the printed circuit board 12 at a pitch of 1 mm, the controller 30 outputs the oscillation trigger signal to the laser oscillator 10 when the counted number becomes equal to 1,000 (1,000 $\mu$m). In addition, the pitch of the holes is preliminarily input as the processing parameter through the parameter-setting unit 32.

The work stage 17 does not repeat the stepwise operation that moves at a predetermined distance and the then stops, but moves at a constant rate. When a portion to be drilled in the printed circuit board 12 reaches a predetermined position, the position is irradiated with the laser light.

When the width size of the mask 11' is smaller than the width size of the processing region 12-1 of the printed circuit board 12, the operation is performed according to FIG. 13. In FIG. 13, it is supposed that the width size L10 of the mask 11' is equal to the width size L20 of the processing region 12-1. In such a case, after the half of the drilling for the processing region 12-1 is completed, the processing region 12-1 is moved by a predetermined distance in a direction perpendicular to the scanning direction and then the drilling is carried out. In this case, the scanning direction during processing in FIG. 13(d) is opposite to the scanning direction in FIG. 13(c). Of course, the formed holes have the same drill pattern.

In this embodiment, the homogenizer 20 described in the second embodiment may be used instead of the homogeneous optical system 13 and the cylindrical lens 15.

By the way, a disadvantage of the fixed mask 11' is that the formed holes are elliptic which has the major axis extending in the scanning direction. However, by using a pulse laser oscillator having a small pulse width, this disadvantage is negligible. For example, it is supposed that the moving rate of the work stage 17 is 150 mm/sec, and if the laser oscillator having a pulse width of 0.2 $\mu$m is used, the work stage 17 moves only 0.03 $\mu$m during the oscillation. In this event, if the diameter of the hole is 50 $\mu$m, the distance 0.03 $\mu$m is negligible, and the shape of the holes can be regarded as a circle.

In every embodiment, the laser oscillator 10 can be implemented by a $CO_2$ laser oscillator, a YAG and YLF laser oscillators, the second harmonic ($2\omega$), the third harmonic (3ω), and the fourth harmonic (4ω) thereof, and an excimer laser oscillator. The workpiece for drilling is not limited to a resinous layer such as a printed circuit board and may be a material such as a ceramic thin plate, which is used as an insulating material in electronic components, for example, capacitors and piezoelectric elements. Furthermore, the present invention can be applied to a contact mask type of drilling in which a mask having a predetermined mask is in contact with the workpiece such as a printed circuit board. In this case, the imaging lens is omitted.

According to the present invention, as described above, many holes can be formed within a short time compared with a known laser drill apparatus using a galvanoscanner. Furthermore, in the mask pattern of the movable mask used in the present invention, since the arrangement of a plurality of holes can be appropriately determined, it is realized the drilling having the flexibility.

According to the drill apparatus in the third to fifth embodiments, holes can be formed exactly at positions to be drilled and the work stage does not move stepwise but moves continuously; thus, this apparatus has high productivity.

INDUSTRIAL APPLICABILITY

As described above, the laser drill method and apparatus according to the present invention is suitable for drill of printed circuit boards and materials such as ceramic thin plates used as insulating materials in electronic components, for example, capacitors and piezoelectric elements.

What is claimed is:

1. A laser drilling method for carrying out the drilling by irradiating a workpiece with laser light from a laser oscillator through a mask having a predetermined mask pattern, wherein said laser light is transformed into laser light having a linear cross-section, an irradiation position of said linear laser light is fixed, and said mask and said workpiece are synchronously moved so that said mask passes through an irradiation position of said laser light while the moving direction thereof is made perpendicular to the extending direction of said linear laser light so that said mask is scanned by said linear laser light, the drilling defined by said mask pattern thereby being carried out to said workpiece.

2. The laser drilling method according to claim 1, wherein, by arranging an imaging lens between said mask and said workpiece, the projection ratio of said mask pattern to said workpiece can be set.

3. The laser drilling method according to either claim 1 or 2, wherein the displacement of said mask or said workpiece is detected, and the oscillation operation of said laser oscillator is controlled in accordance with the detected displacement.

4. A laser drilling method for carrying out the drilling by irradiating a workpiece with laser light from a laser oscillator through a mask having a predetermined mask pattern, wherein said laser light is transformed into laser light having a linear cross-section, said mask arranged at a predetermined position is irradiated with said linear laser light, and said workpiece is moved in the perpendicular direction to the extending direction of said linear laser light, so that said workpiece is scanned by said laser light passing through said mask, the drilling defined by said mask pattern thereby being carried out to said workpiece, wherein the displacement of said workpiece is detected, and the oscillation operation of said laser oscillator is controlled in accordance with the detected displacement.

5. The laser drilling method according to claim 4, wherein, by arranging an imaging lens between said mask and said workpiece, the projection ratio of said mask pattern to said workpiece can be set.

6. A laser drilling apparatus for carrying out the drilling by irradiating a workpiece with laser light from a laser oscillator through a mask having a predetermined mask pattern, said apparatus comprising:

an optical system for transforming said laser light into laser light having a linear cross-section; and a drive mechanism for synchronously moving said mask and said workpiece;

an irradiation position of said linear laser light from said optical system being fixed, said drive mechanism moves said mask and said workpiece so that said mask passes through an irradiation position of said laser light, the moving direction thereof being made perpendicular to the extending direction of said linear laser light so that said mask is scanned by said linear laser light, the drilling defined by said mask pattern thereby being carried out to said workpiece.

7. The laser drilling apparatus according to claim 6, wherein an imaging lens is arranged between said mask and said workpiece and the projection ratio of said mask pattern to said workpiece can be set by said imaging lens.

8. The laser drilling apparatus according to either claim 6 or 7, wherein said optical system is a homogenizer.

9. The laser drilling apparatus according to either claim 6 or 7, wherein said optical system comprises a homogeneous optical system that homogenizes the energy density about the cross-section of the laser light from said laser oscillator and a cylindrical lens that transforms the cross-section of the laser light from said homogeneous optical system into a linear shape.

10. The laser drilling apparatus according to claim 6 or 7, further comprising a position detector for detecting the displacement of said workpiece and a controller for controlling the oscillation operation of said laser oscillator in accordance with the displacement detected by said position detector.

11. The laser drilling apparatus according to claim 6 or 7, further comprising a position detector for detecting the displacement of said mask and a controller for controlling the oscillation operation of said laser oscillator in accordance with the displacement detected by said position detector.

12. A laser drilling apparatus for carrying out the drilling by irradiating a workpiece with laser light from a laser oscillator through a mask having a predetermined mask pattern, said apparatus comprising:

an optical system for transforming said laser light into laser light having a linear cross-section; and a drive mechanism for moving said workpiece;

said mask arranged at a predetermined position being irradiated with said linear laser light from said optical system, said drive mechanism moves said workpiece in the perpendicular direction to the extending direction of the linear laser light so that said workpiece is scanned by the laser light passing through said mask, the drilling defined by said mask pattern thereby being carried out to said workpiece, wherein the displacement of said workpiece is detected, and the oscillation operation of said laser oscillator is controlled in accordance with the detected displacement.

13. The laser drilling apparatus according to claim 12, wherein an imaging lens is arranged between said mask and said workpiece and the projection ratio of said mask pattern to said workpiece can be set by said imaging lens.

14. The laser drilling apparatus according to either claim 12 or 13, wherein said optical system is a homogenizer.

15. The laser drilling apparatus according to either claim 12 or 13, wherein said optical system comprises a homogeneous optical system that homogenizes the energy density about the cross-section of the laser light from said laser oscillator and a cylindrical lens that transforms the cross-section of the laser light from said homogeneous optical system into a linear shape.

16. The laser drilling apparatus according to claim 12 or 13, further comprising a position detector for detecting the displacement of said workpiece and a controller for controlling the oscillation operation of said laser oscillator in accordance with the displacement detected by the position detector.

\* \* \* \* \*